(12) United States Patent
Srinivasan et al.

(10) Patent No.: US 12,334,889 B1
(45) Date of Patent: Jun. 17, 2025

(54) GAIN CONTOL TO OPTIMIZE SENSITIVITY AND BLOCKING PERFORMANCE

(71) Applicant: Silicon Laboratories Inc., Austin, TX (US)

(72) Inventors: Rangakrishnan Srinivasan, Austin, TX (US); Abdulkerim Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 45 days.

(21) Appl. No.: 18/539,468

(22) Filed: Dec. 14, 2023

(51) Int. Cl.
*H03G 3/30* (2006.01)

(52) U.S. Cl.
CPC ......... *H03G 3/3068* (2013.01); *H03G 3/3089* (2013.01)

(58) Field of Classification Search
CPC ............................ H03G 3/3089; H03G 3/3068
USPC .......................................................... 375/345
See application file for complete search history.

(56) References Cited

U.S. PATENT DOCUMENTS

| | | | |
|---|---|---|---|
| 5,095,533 A | 3/1992 | Loper et al. | |
| 5,734,683 A | 3/1998 | Hulkko et al. | |
| 5,777,494 A | 7/1998 | Takahashi | |
| 6,195,399 B1 | 2/2001 | Dent et al. | |
| 6,735,260 B1 | 5/2004 | Eliezer et al. | |
| 6,771,720 B1 | 8/2004 | Yang et al. | |
| 7,212,798 B1 | 5/2007 | Adams et al. | |
| 8,180,308 B1 | 5/2012 | Neng et al. | |
| 8,346,202 B2 | 1/2013 | Coban et al. | |
| 8,554,136 B2 | 10/2013 | McCormack | |
| 8,811,526 B2 | 8/2014 | McCormack et al. | |
| 8,912,785 B2 | 12/2014 | Horvath | |
| 9,172,344 B2 | 10/2015 | Green et al. | |
| 9,203,452 B2 | 12/2015 | Li et al. | |
| 9,322,904 B2 | 4/2016 | McCormack et al. | |
| 9,379,450 B2 | 6/2016 | Kyles et al. | |
| 9,407,311 B2 | 8/2016 | McCormack et al. | |
| 9,426,660 B2 | 8/2016 | McCormack et al. | |
| 9,444,523 B2 | 9/2016 | McCormack et al. | |
| 9,515,365 B2 | 12/2016 | McCormack et al. | |
| 9,515,859 B2 | 12/2016 | McCormack et al. | |
| 9,736,790 B1 | 8/2017 | Haub et al. | |
| 9,831,836 B1* | 11/2017 | de Ruijter | H03G 3/3068 |
| 9,948,347 B2 | 4/2018 | Milenkovic | |
| 10,230,345 B1* | 3/2019 | Arslan | H04B 1/0007 |
| 10,469,112 B2 | 11/2019 | Coban | |
| 2004/0190650 A1 | 9/2004 | Khorram et al. | |
| 2004/0196017 A1 | 10/2004 | Sutardja et al. | |

(Continued)

FOREIGN PATENT DOCUMENTS

| | | | |
|---|---|---|---|
| WO | 2013130486 A1 | 9/2013 | |
| WO | WO-2022062883 A1 * | 3/2022 | H04W 52/243 |

*Primary Examiner* — Leila Malek
(74) *Attorney, Agent, or Firm* — Trop, Pruner & Hu, P.C.

(57) ABSTRACT

In one embodiment, a method includes: setting, via a controller of a receiver, a plurality of gain components of the receiver for a maximum gain setting for an automatic gain control (AGC) sensitivity (SENS) mode; receiving, in a controller of the receiver, an indication that a power level of an intermediate frequency (IF) signal measured at an output of an IF amplifier of the receiver exceeds a first threshold; and transitioning from an AGC SENS mode to an AGC adjacent channel interference (ACI) mode in response to the indication that the power level of the IF signal exceeds the first threshold.

20 Claims, 8 Drawing Sheets

(56) References Cited

U.S. PATENT DOCUMENTS

| | | |
|---|---|---|
| 2005/0186910 A1 | 8/2005 | Moorti et al. |
| 2005/0186917 A1 | 8/2005 | Rofougaran et al. |
| 2007/0248192 A1 | 10/2007 | Brunsch et al. |
| 2008/0160945 A1 | 7/2008 | Crinon et al. |
| 2010/0026547 A1 | 2/2010 | Weissman et al. |
| 2010/0153589 A1 | 6/2010 | Maroni et al. |
| 2010/0172450 A1 | 7/2010 | Komaili et al. |
| 2010/0246714 A1 | 9/2010 | Yang et al. |
| 2011/0009080 A1 | 1/2011 | Seendripu et al. |
| 2012/0121043 A1 | 5/2012 | Wambacq |
| 2012/0249366 A1 | 10/2012 | Pozgay et al. |
| 2012/0263244 A1 | 10/2012 | Kyles et al. |
| 2012/0307932 A1 | 12/2012 | McCormack et al. |
| 2012/0319774 A1 | 12/2012 | Ibrahim et al. |
| 2012/0326904 A1 | 12/2012 | Jensen et al. |
| 2013/0070817 A1 | 3/2013 | McCormack et al. |
| 2013/0195215 A1 | 8/2013 | Manglani et al. |
| 2013/0196598 A1 | 8/2013 | McCormack et al. |
| 2013/0257670 A1 | 10/2013 | Sovero et al. |
| 2013/0316653 A1 | 11/2013 | Kyles et al. |
| 2014/0016723 A1 | 1/2014 | Mu et al. |
| 2014/0160939 A1 | 6/2014 | Arad et al. |
| 2014/0273856 A1 | 9/2014 | Kyles et al. |
| 2014/0273894 A1 | 9/2014 | McCormack et al. |
| 2014/0281534 A1 | 9/2014 | McCormack et al. |
| 2014/0286643 A1 | 9/2014 | George et al. |
| 2014/0341232 A1 | 11/2014 | McCormack et al. |
| 2015/0031320 A1 | 1/2015 | Li et al. |
| 2015/0048959 A1 | 2/2015 | Zhu |
| 2015/0065069 A1 | 3/2015 | McCormack et al. |
| 2015/0094002 A1 | 4/2015 | Kyles et al. |
| 2015/0131683 A1 | 5/2015 | De Ruijter et al. |
| 2015/0381228 A1 | 12/2015 | Milenkovic |
| 2016/0036495 A1 | 2/2016 | McCormack et al. |
| 2016/0064827 A1 | 3/2016 | Kyles et al. |
| 2016/0344484 A1 | 11/2016 | Nakamura et al. |
| 2016/0380676 A1 | 12/2016 | McCormack et al. |
| 2017/0046299 A1 | 2/2017 | Isaac et al. |
| 2017/0086281 A1 | 3/2017 | Avrahamy |
| 2017/0373709 A1 | 12/2017 | Kondo et al. |
| 2018/0041235 A1 | 2/2018 | Kyles et al. |
| 2018/0309602 A1 | 10/2018 | Zheng et al. |

\* cited by examiner

FIG. 5 ns
GAIN CONTOL TO OPTIMIZE SENSITIVITY AND BLOCKING PERFORMANCE

BACKGROUND

In a radio receiver, an incoming radio frequency (RF) signal is received via an antenna. The signal is then processed in a signal processing path of the receiver. General receive operations include amplification, downconversion, filtering and digitization, resulting in a digitized signal that can then be digitally processed, such as demodulation for a particular modulation technique.

Many receivers include multiple amplifiers or other gain components. At least some of these gain components may be controlled. While many gain control techniques are known, such techniques can suffer from various impairments, including complexity and processing difficulties. One such complexity is that for some wireless protocols such as certain Wi-Fi (e.g., IEEE 802.11) protocols, there is a tradeoff between sensitivity and blocking performance across different modulation coding scheme (MCS) conditions. That is, across different MCS conditions and bandwidths, sensitivity and blocking conditions overlap, and it is typically not possible to optimize the receiver across MCS conditions and bandwidth as these can change in real-time.

SUMMARY OF INVENTION

In one aspect, a receiver includes: a low noise amplifier (LNA) to receive and amplify a radio frequency (RF) signal; a mixer to downconvert the RF signal to an intermediate frequency (IF) signal; a programmable gain amplifier (PGA) coupled to the mixer to amplify the IF signal, the LNA, the mixer, and the PGA having a first controllable gain; a filter coupled to the PGA to filter the amplified IF signal, the filter having a second controllable gain; a digitizer coupled to the filter to digitize the filtered IF signal to a digitized signal; a first power detector coupled to an input of the LNA, the first power detector to output a first detection signal in response to the RF signal exceeding a first threshold; a second power detector coupled to an output of the PGA, the second power detector to output a second detection signal in response to the IF signal exceeding a second threshold; and a controller to transition from an automatic gain control (AGC) sensitivity (SENS) mode to an AGC adjacent channel interference (ACI) mode in response to the second detection signal.

In one implementation, in the AGC ACI mode, the controller is to first back off the second controllable gain and thereafter back off the first controllable gain. The receiver may further include at least one RF gain component coupled to an input of the LNA, the at least one RF gain component having a third controllable gain, where, after the back off of the first controllable gain, the controller is to back off the third controllable gain. The controller may thereafter remove the third controllable gain, and if the signal metric information exceeds the third threshold, further adjust the first controllable gain. In the AGC SENS mode, the controller is to first back off the second controllable gain and thereafter back off the first controllable gain.

In one implementation, in response to the first detection signal, the controller is to directly back off a gain of at least one RF gain component. In response to the first detection signal, the controller is to directly back off the gain of the at least one RF gain component until the first detection signal indicates that the RF signal is less than the first threshold.

In one implementation: in the AGC SENS mode, the controller is to optimize the receiver for noise performance; and in the AGC ACI mode, the controller is to optimize the receiver for linearity and headroom. In the AGC SENS mode, the controller is to cause a maximum RF gain setting for at least the LNA. And, in the AGC SENS mode, the controller is to cause the maximum RF gain setting for at least the LNA, unless a blocker signal is detected. The receiver may further include a plurality of gain tables, where at least one first gain table is associated with the AGC SENS mode and at least one second gain table is associated with the AGC ACI mode.

In another aspect, a method includes: setting, via a controller of a receiver, a plurality of gain components of the receiver for a maximum gain setting for an AGC SENS mode; receiving, in a controller of the receiver, an indication that a power level of an IF signal measured at an output of an IF amplifier of the receiver exceeds a first threshold, the IF signal derived from a RF signal received in the receiver; and transitioning from the AGC SENS mode to an AGC ACI mode in response to the indication that the power level of the IF signal exceeds the first threshold.

In one implementation, the method may further include dynamically adjusting a gain setting for one or more of the plurality of gain components of the receiver based on a received signal strength indication obtained from a digital processor of the receiver. This dynamic adjusting the gain setting for one or more of the plurality of gain components may include: dynamically adjusting the gain setting for the one or more of the plurality of gain components in a first order for the AGC SENS mode; and dynamically adjusting the gain setting for the one or more of the plurality of gain components in a second order for the AGC ACI mode.

In one or more implementations, the method may further include adjusting a gain setting of a filter of the receiver, the filter coupled to an output of the IF amplifier, in response to the indication that the power level of the IF signal exceeds the first threshold. The method may also include: receiving, in the controller of the receiver, an indication that a power level of the RF signal exceeds a second threshold; and dynamically adjusting a gain setting for at least one RF gain component of the receiver in response to the indication that the power level of the RF signal exceeds the second threshold. Also, the method may include: in the AGC SENS mode, optimizing the receiver for noise performance; and in the AGC ACI mode, optimizing the receiver for linearity.

In yet another aspect, a wireless device includes an antenna to transmit a transmit RF signal and to receive a receive RF signal and an integrated circuit (IC) coupled to the antenna.

The IC may include: an attenuator controllable to attenuate the receive RF signal, the attenuator comprising a first gain control region; a LNA coupled to the attenuator to receive and amplify the receive RF signal; a mixer to downconvert the receive RF signal to an IF signal; an IF amplifier coupled to the mixer to amplify the IF signal, the LNA, the mixer, and the IF amplifier comprising a second gain control region; a filter coupled to the IF amplifier to filter the amplified IF signal, the filter comprising a third gain control region; a digitizer coupled to the filter to digitize the filtered IF signal to a digitized signal; and a digital signal processor (DSP) coupled to the digitizer, the DSP to process the digitized signal; and a controller to transition from an AGC SENS mode to an AGC ACI mode in response to the second detection signal.

The wireless device further includes: a first power detector coupled to an output of the attenuator, the first power detector to output a first detection signal in response to the receive RF signal output from the attenuator exceeding a first threshold; and a second power detector coupled to an output of the IF amplifier, the second power detector to output a second detection signal in response to the amplified IF signal exceeding a second threshold.

In one implementation, the wireless device further comprises a storage to store a plurality of gain tables, where at least one first gain table is associated with the AGC SENS mode and at least one second gain table is associated with the AGC ACI mode.

In one implementation, the controller is to: dynamically adjust the first gain control region, the second gain control region and the third gain control region in a first order for the AGC SENS mode; and dynamically adjust the first gain control region, the second gain control region and the third gain control region in a second order for the AGC ACI mode.

DETAILED DESCRIPTION

In various embodiments, a receiver is provided with techniques for performing automatic gain control (AGC) operation in a manner to dynamically accommodate changes in receiver operation (e.g., MCS changes) via dynamic changes in AGC modes. To this end, a receiver may be configured to operate in a selected one of at least two AGC modes dynamically. Herein, the discussion assumes two modes, referred to as: (1) a sensitivity (SENS) mode; and (2) an adjacent channel interference (ACI) mode. Details of these modes are discussed below. At a high level, suffice to say that gain control operations occur differently in these different modes. At a minimum in these different AGC modes, different gain settings are provided for control of various gain components of a receiver signal processing path. Also in some cases, different gain components may be enabled/disabled in the different modes, and further it is possible to differently control an order of gain updates to the individual gain components.

Embodiments may quickly identify channel conditions that trigger these mode changes based at least in part on power detectors that are adapted at specific locations throughout the receiver signal processing path. More specifically, embodiments include power detectors that operate at radio frequency (RF) levels and at intermediate frequency (IF) levels. A controller is configured to receive information from these power detectors and based at least in part thereon, dynamically change AGC modes and cause dynamic updates to gain settings of one or more gain components.

These quick updates to gain settings of the various gain components occur so that communicated information is not lost. More specifically, embodiments may be used in receivers for a wide range of packet-based communication protocols in which AGC component updates can occur within a preamble portion of the packet communication, so that gain settings can be updated and finalized, prior to communication of actual payload data of the packet. As examples, packet-based protocols such as Wi-Fi, Bluetooth™, Zigbee™, as well as many other Internet of Things (IoT) protocols may leverage embodiments. Embodiments may be applicable to receivers for both constant amplitude modulated signals (such as frequency shift keying (FSK), Gaussian frequency shift keying (GFSK), minimum shift keying (MSK)), and most other sub-gigahertz (GHZ) IoT standards and non-constant amplitude modulated signals (such as OFDM).

As discussed, across different MCS conditions and bandwidths at which devices communicate according to different wireless communication protocols, sensitivity and blocking conditions overlap. Sensitivity refers to minimum signal level of an incoming and desired RF signal for successful reception. Blocking refers to an undesired signal, which if of a relatively close channel to a desired signal, can adversely affect proper reception of the desired signal. Embodiments can dynamically trade off between sensitivity and blocking performance, thus optimizing the receiver across MCS conditions and bandwidth. These MCS conditions and bandwidth can change in real-time as communications occur over the air.

More specifically, embodiments can reliably trade off between sensitivity and blocking performance for various wireless communication protocols such as IEEE 802.11 a/b/g/n/ax (at various bandwidths, e.g., 20/40/80 MHz bandwidths) due to overlap range across different MCS conditions. Stated another way, there is an overlap of sensitivity and ACI conditions as an environment and operations change, as shown in Tables 1 and 2 below. Depending on operational situation, sensitivity benefits from an AGC SENS mode, and blocking benefits from ACI AGC mode for headroom and linearity.

Referring to Table 1, shown is an overlap of SENS and ACI conditions for IEEE 802.11b/g/n/ax operating at 2.4 GHz and 20 MHz. As shown in Table 1, there is a range of conditions for which AGC switches (e.g., toggles) between AGC SENS and AGC ACI modes.

TABLE 1

| Sl. No. | Mode | Demod | Condition | RFIn (dBm) | AGC |
| --- | --- | --- | --- | --- | --- |
| 1 | 11b | 11b | 1 Mbps | −100 | SENS |
| 2 | 11g/n/ax | OFDM | MCS0 | −94 | SENS |
| 3 | 11b | 11b | 11 Mbps | −90 | SENS |
| 4 | 11g/n/ax | OFDM | MCS4 | −84 | SENS |
| 5 | 11g/n/ax | OFDM | MCS0 | −79 | ACI |
| 6 | 11g/n/ax | OFDM | MCS7 | −76 | SENS |
| 7 | 11b | 11b | 1 Mbps | −74 | ACI |
| 8 | 11g/n/ax | OFDM | MCS9 | −70 | SENS |
| 9 | 11b | 11b | 11 Mbps | −70 | ACI |
| 10 | 11g/n/ax | OFDM | MCS4 | −67 | ACI |
| 11 | 11g/n/ax | OFDM | MCS7 | −61 | ACI |
| 12 | 11g/n/ax | OFDM | MCS9 | −54 | ACI |

Referring to Table 2, shown is an overlap of SENS and ACI conditions for IEEE 802.11a/n/ax operating at 5 GHz and 20/40/80 MHz

TABLE 2

| Sl. No. | Mode | BW | Condition | RFIn (dBm) | AGC |
|---|---|---|---|---|---|
| 1 | 11a/n/ax | 20 MHz | MCS0 | −93 | SENS |
| 2 | 11a/n/ax | 40 MHz | MCS0 | −90 | SENS |
| 3 | 11a/n/ax | 80 MHz | MCS0 | −87 | SENS |
| 4 | 11a/n/ax | 20 MHz | MCS4 | −82 | SENS |
| 5 | 11a/n/ax | 40 MHz | MCS4 | −79 | SENS |
| 6 | 11a/n/ax | 20 MHz | MCS0 | −79 | ACI |
| 7 | 11a/n/ax | 80 MHz | MCS4 | −76 | SENS |
| 8 | 11a/n/ax | 40 MHz | MCS0 | −76 | ACI |
| 9 | 11a/n/ax | 20 MHz | MCS7 | −75 | SENS |
| 10 | 11a/n/ax | 80 MHz | MCS0 | −73 | ACI |
| 11 | 11a/n/ax | 40 MHz | MCS7 | −72 | SENS |
| 12 | 11a/n/ax | 20 MHz | MCS9 | −70 | SENS |
| 13 | 11a/n/ax | 80 MHz | MCS7 | −69 | SENS |
| 14 | 11a/n/ax | 40 MHz | MCS9 | −67 | SENS |
| 15 | 11a/n/ax | 20 MHz | MCS4 | −67 | ACI |
| 16 | 11a/n/ax | 80 MHz | MCS9 | −64 | SENS |
| 17 | 11a/n/ax | 40 MHz | MCS4 | −64 | ACI |
| 18 | 11a/n/ax | 80 MHz | MCS4 | −61 | ACI |
| 19 | 11a/n/ax | 20 MHz | MCS7 | −61 | ACI |
| 20 | 11a/n/ax | 40 MHz | MCS7 | −58 | ACI |
| 21 | 11a/n/ax | 80 MHz | MCS7 | −55 | ACI |
| 22 | 11a/n/ax | 20 MHz | MCS9 | −54 | ACI |
| 23 | 11a/n/ax | 40 MHz | MCS9 | −51 | ACI |
| 24 | 11a/n/ax | 80 MHz | MCS9 | −48 | ACI |

As shown in these Tables, for a 20 MHz case, IEEE 802.11 n/ax MCS7 sensitivity overlaps with blocking conditions for MCS0-4; and IEEE 802.11 n/ax MCS9 sensitivity overlaps with blocking conditions for IEEE 802.11b (1 Mbps and 11 Mbps). Thus the sensitivity-ACI tradeoff is tightly coupled for IEEE 802.11 b/g/n/ax-20 MHz modes.

In general, sensitivity needs best noise performance and maximum RF gain for the receiver. At reference sensitivity levels (where typical blocking tests for ACI, alternate adjacent channel interference (AACI) and out of band (OOB) blocking are defined) and beyond, the receiver needs to be configured for best linearity and headroom performance, with optimal RF gain.

The problem of headroom, defined as the maximum signal at the output of a given receiver block, before clipping occurs, is exacerbated for IEEE 802.11ax. In lower process nodes with lower supply voltages, there is a reduction in dynamic range at the output of an RF portion of the signal processing path. Also with IEEE 802.11ax, peak-to-average power (PAPR) is higher due to increased numbers of sub-carriers, and there is lower RF filtering due to adjacent channel sub-carriers being closer to a band-edge as compared to IEEE 802.11 a/b/g/n. All of the above factors can lead to a reduction in dynamic range at this RF path output. Therefore, the maximum RF gain for the receiver at sensitivity would affect the available headroom for the blocker and limit blocking performance.

Additionally, linearity requirements for the IEEE 802.11b-11 Mbps data rate is the driving consideration for input third order intercept point (IIP3), which requires higher IIP3 than for other IEEE 802.11 a/g/n/ax modes. For example, in the first case IIP3 requirements could be −6 dBm and in the second case IIP3 requirements could be 5 dB lower, at −11 dBm. And using the knowledge of IEEE 802.11b vs. OFDM (802.11a/g/n/ax) information, appropriate gain tables can achieve the required IIP3 at reference sensitivity conditions without over-designing the receiver for higher IIP3 to obtain the best noise and linearity performance.

Figure 1:
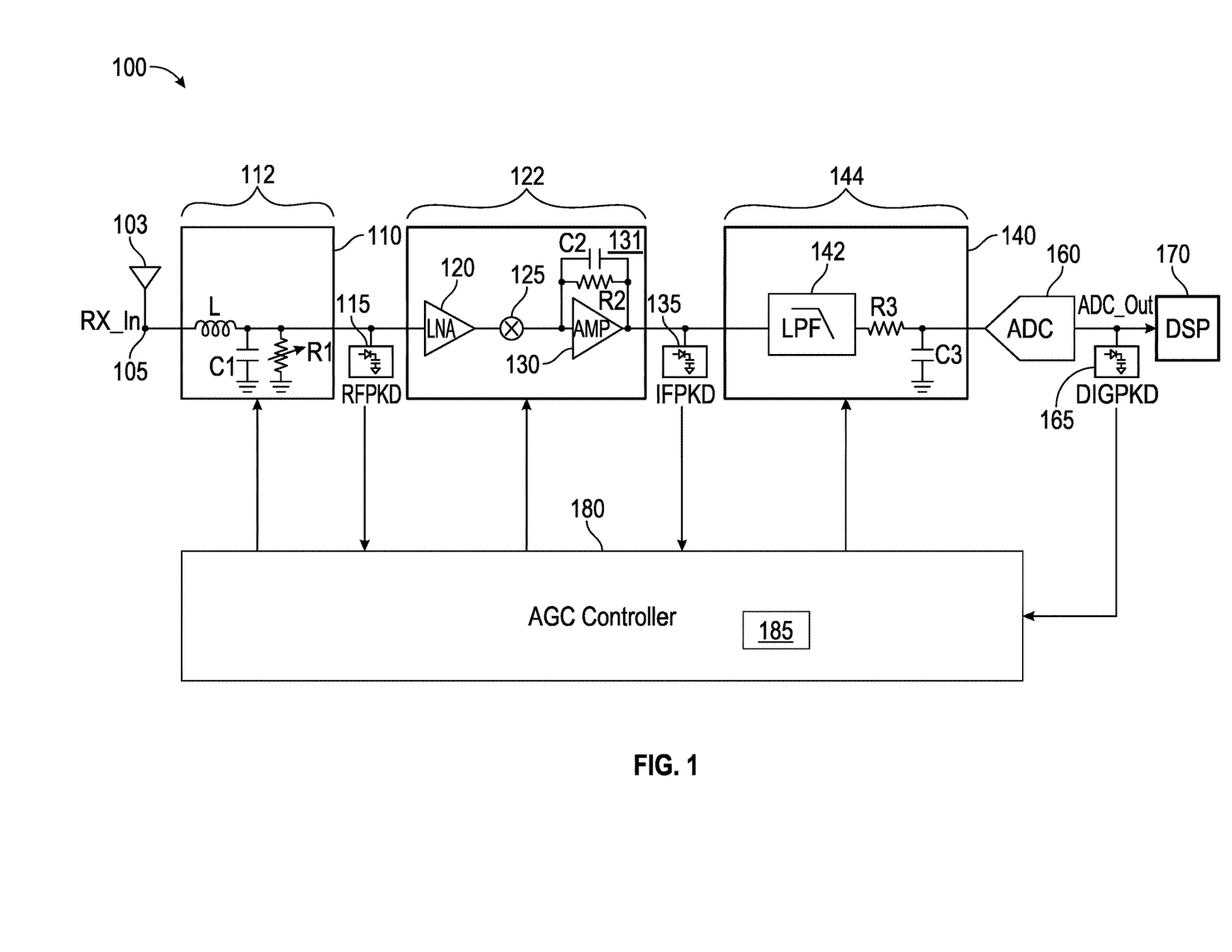
FIG. 1 is a block diagram of a receiver in accordance with an embodiment.

Referring now to FIG. 1, shown is a block diagram of a receiver in accordance with an embodiment. As shown in FIG. 1, receiver 100 is a radio receiver that may be adapted in any type of wireless device. In various embodiments, an input node 105, which may be an input pin of an integrated circuit (IC) including the receiver, receives an incoming RF signal (RX_In) from an antenna 103. As seen, the RF signal is provided to an attenuator 110. In an embodiment, attenuator 110 may be implemented as a passive gain network, e.g., including an inductor (L) and parallel-coupled capacitance (C1) and resistance (R1). In different embodiments, one or more of these RLC components can be dynamically controlled to control an amount of attenuation, such that attenuator 110 is considered one of the gain components of receiver 100, namely a first gain control region 112 of receiver 100. Although embodiments are not limited in this regard, in one particular embodiment attenuator 110 may provide for a controllable gain of −15 dB to 9 dB (e.g., with 2 dB steps per update). In one embodiment, the resistance R1 may be dynamically controlled to adjust the gain setting of first gain control region 112. Note that first gain control region 112 can be employed in SENS mode as well under high input conditions.

After any attenuation in attenuator 110, the RF signal is provided to a low noise amplifier (LNA) 120 which, depending on implementation, can be a current mode low noise transconductance amplifier (LNTA) or a voltage mode LNA. As used herein, the terms "low noise amplifier" and "LNA" encompass both a current mode LNTA and a voltage mode LNA, unless specifically stated otherwise. After amplification in LNA 120, the RF signal is provided to a mixer 125. In various embodiments, mixer 125 downconverts the RF signal to an IF signal. From there, the IF signal is provided to a programmable gain amplifier (PGA), implemented in the FIG. 1 embodiment as a transimpedance amplifier (TIA) 131, formed by an amplifier 130 and feedback filter formed of capacitor C2 and resistor R2 (e.g., a first order filtering function). TIA 131 operates to convert mixer IF current into a voltage signal. In other implementations, the PGA may be implemented as a voltage mode PGA. As used herein, the terms "programmable gain amplifier" and "PGA" encompass both a current mode TIA and a voltage mode PGA, unless specifically stated otherwise.

Note that LNA 120, mixer 125 and TIA 131 constitute a second gain control region 122 of receiver 100 (where these components collectively may be referred to as an "LMT" block). Although embodiments are not limited in this regard, in one particular embodiment, second gain control region 122 may have a controllable gain that ranges from 0 dB to 33 dB (e.g., with nominally two dB steps).

Still with reference to FIG. 1, the output of TIA 131 is provided to a low pass filter (LPF) 140 for low pass filtering. In one embodiment, LPF 140 can be implemented with a biquadratic filter 142. Although not shown for ease of illustration in FIG. 1, LPF 140 may include a PGA to control a gain of biquadratic filter 142. In the embodiment shown, LPF 140 constitutes a third gain control region 144. Although embodiments are not limited in this regard, in one particular embodiment third gain control region 144 may have a controllable gain of between −10 dB to 20 dB (e.g., with two dB steps). Note that in the implementation of FIG. 1, additional anti-aliasing filtering may be performed by RC components (namely resistor R3 and capacitor C3). The filtered IF signal output from LPF 140 is provided to a digitizer, namely an analog-to-digital converter (ADC) 160.

Note that this discussion of FIG. 1 enumerates the independent gain control regions as "first," "second," and "third"

gain control regions. Understand that this enumeration is for purposes of convenience and discussion only, and these different regions can be enumerated differently (including in the claims below).

Still referring to FIG. 1, the digitized output of ADC 160 (ADC_Out) is provided to a digital signal processor (DSP) 170. DSP 170 may analyze the channel filtered output to determine received signal strength indicator (RSSI) information which, as described herein, may be used to perform fine tuning of one or more of the gain components, in certain cases. DSP 170 may also digitally process and output processed data.

Still referring to FIG. 1, the RF signal after attenuation in attenuator 110 is further provided to a first peak detector 115, which operates as a wide-band detector to compare the power of the RF signal output from attenuator 110 to a first threshold (Pth1). First peak detector 115 may operate to sense the incoming signal at RF and provide an estimate of an incoming undesired blocker at an offset from the desired signal. For example the offset can be 400 MHz away, and the blocker can be 80 MHz wide. Thus first peak detector 115 primarily helps to improve out-of-band blocking performance and coexistence. When the RF signal level exceeds this threshold, peak detector 115 outputs an active detection signal, RFPKD, to an AGC controller 180, details of which are described below. Although embodiments are not limited in this regard, in one particular embodiment this first threshold Pth1 may be set at −22 dBm for AGC SENS mode and −30 dBm for AGC ACI mode. Of course other values are possible in other embodiments.

As further illustrated, the IF signal output from TIA 130 is provided to another peak detector 135, which in the embodiment shown is an IF peak detector. Peak detector 135 operates as a wide-band detector to compare this IF signal power to a second threshold (Pth2). Peak detector 135 operates to estimate an 80 MHz channel along with filtering from TIA 130. In one embodiment, this second threshold Pth2 may be set at −8 dBm for AGC SENS mode and −18 dBm for AGC ACI mode, although of course other values are possible. Peak detector 135 located at the output of TIA 130 provides an indication of headroom limitation and can sense saturation conditions for all of ACI, AACI, and OOB blockers (e.g. LTE signals). As with the discussion above, when the IF signal level exceeds this threshold, peak detector 135 outputs an active detection signal, IFPKD, to AGC controller 180.

Without an embodiment having this appropriately located IF detector, (e.g., instead located at a filter output), the combination of the RF and such differently located IF power detector (e.g., further downstream in the receiver signal processing path) could be insufficient to decouple the noise-linearity tradeoff, as the blocker level could be undetectable, either due to lower gain at the LNA input or higher filtering. With an embodiment, information regarding the signal level at a TIA output, possibly in conjunction with an RSSI-based signal level, can enable a different gain backoff and AGC operation to achieve optimal linearity and headroom performance.

FIG. 1 also shows a digital peak detector 165 coupled to the output of ADC 160. Although shown as a separate component, understand that in some embodiments ADC 160 may perform peak detection as part of digitization, essentially making this peak detection "free" (e.g., when ADC 160 is implemented as a successive approximation register ADC). This digital peak detector can be used to detect saturation levels since it includes blocker information (as it is located prior to a channel select filter in DSP 170). Digital peak detector 165 operates to compare this digital output to another threshold. In one embodiment, this threshold may be set at −4 dBm for AGC SENS mode, and −18 dBm for AGC ACI mode, although of course other values are possible. As with the discussion above, when the digital signal level exceeds this threshold, peak detector 165 outputs an active detection signal, DIGPKD, to AGC controller 180.

Also, with the above-described example gain controllability for the first, second and third gain control regions, the receiver overall may have a controllable gain total (Gtotal) of 102 dB from −40 dB to 62 dB. More specifically, each of the individually controllable gain control regions may have maximum gain settings of, respectively, 9 dB, 33 dB and 20 dB (corresponding to max(G1, G2, G3)).

AGC controller 180, in an embodiment, may be implemented as a dedicated microcontroller or other programmable hardware control circuit such as programmable logic. In other cases, AGC controller 180 may be implemented using other hardware circuitry, firmware, software and/or combinations thereof to control gain settings of various gain components within receiver 100 based on the detected outputs from one or more of peak detectors 115, 135, and 165. Furthermore, understand that AGC controller 180 may efficiently perform this gain control within a small time window, e.g., completely within a preamble portion of a data communication, such that no payload data of the communication is lost.

As further illustrated, AGC controller 180 includes a storage 185, which in embodiments may be implemented as a non-volatile storage or other non-transitory storage medium. Non-volatile storage 185 may store tables including a plurality of entries, each to store a set of predetermined gain settings for the various gain components of receiver 100, such that under control of gain controller 180, a selected group of settings can be accessed and used to update the gain settings of the corresponding gain components within receiver 100. At least two such tables may be provided, one for the AGC SENS mode and one for the AGC ACI mode.

Note that predetermined gain settings may be used to populate the tables, since characteristics of the receiver known a priori are used to determine these gain settings, e.g., during design time, as confirmed during laboratory testing of actual receivers (such as manufactured integrated circuits). In this way, it is guaranteed that these predetermined settings, when used by a controller as described herein to perform AGC operations during a preamble portion of a packet communication, enable a receiver to perform receive operations in a manner that enables an optimal trade off between sensitivity and ACI performance over varying channel conditions.

Figure 2:
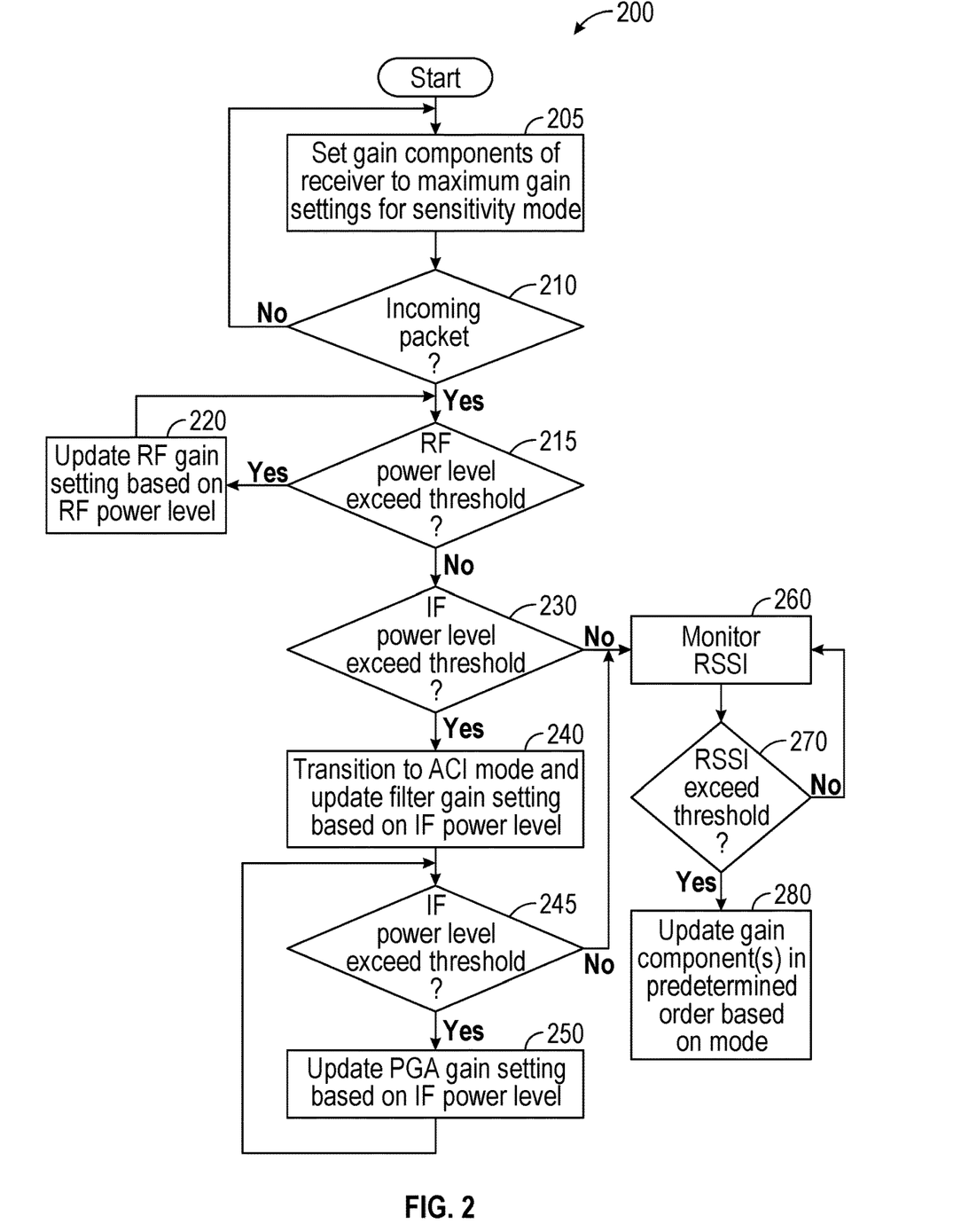
FIG. 2 is a flow diagram of a method in accordance with an embodiment.

Referring now to FIG. 2, shown is a flow diagram of a method in accordance with an embodiment. More specifically, method 200 is a method for performing automatic gain control as described herein. As such, method 200 may be performed by an AGC controller such as AGC controller 180 of FIG. 1 to perform AGC during a preamble portion of a packet communication.

As illustrated, method 200 begins by setting gain components of the receiver to their maximum gain settings for an AGC SENS mode (block 205). Next, control passes to diamond 210, where it is determined whether an incoming packet is being received within a receiver. If so, it is determined at diamond 215 whether the RF power level exceeds a given threshold (e.g., based on a signal from the RF power detector). Note that this threshold level can be programmable. If it is determined that the RF power level exceeds the threshold, control passes to block 220 where an RF gain setting may be updated based on the RF power level. This is the case, since with a high incoming power level, there is either a strong blocker or the desired signal is very strong and would benefit from front end back off so that the receiver circuitry does not become saturated.

Depending upon implementation, various gain settings can be updated. With reference back to FIG. 1, gain settings of one or more RF front end gain components (e.g., resistive and capacitive attenuators) can be updated. Specifically, one or more of these components can have their gain settings backed off to reduce the power level that is received in the LNA.

Still referring to FIG. 2, if it is determined that the RF power level does not exceed the threshold, control passes next to diamond 230 to determine whether the IF power level exceeds a given threshold. With reference back to FIG. 1, this IF power level is measured via the IF peak detector coupled to an output of the IF gain stage (e.g., TIA or PGA). If this power level is exceeded, control passes to block 240.

At block 240 the receiver transitions to an AGC ACI mode. This transition may be implemented by switching from use of an AGC SENS mode table to use of an AGC ACI mode table. Still further, a gain setting for a filter gain component may be updated based on the detected IF power level. Depending upon implementation, this filter gain setting may be updated by backing off its gain, either completely or via an iterative reduction. For purposes of method 200, assume that this filter gain setting is backed off completely at block 240. Of course in other implementations there may be iterative filter gain setting updates with smaller gain reductions and continued analysis of the IF power level to determine whether the power level still exceeds the threshold.

Still with reference to the FIG. 2 implementation, control passes from block 240 to diamond 245 to determine whether the IF power level still exceeds the threshold. In this implementation, this determination thus indicates whether the IF power level still exceeds the threshold when the filter gain setting has been completely backed off. If the IF power level does exceed this threshold, control passes to block 250, where a PGA gain setting may be updated based on the power level. For example, a small iterative gain reduction can be performed. Then control passes back to diamond 245 to determine whether the IF power level still exceeds the threshold. This loop between diamond 245 and block 250 occurs until the IF power level no longer exceeds the threshold.

Referring still to FIG. 2, at block 260 a RSSI value may be monitored. Understand that this RSSI value is a digital representation of signal strength, and can be used to further control gain components of the receiver. At diamond 270, it is determined whether the RSSI value exceeds a given threshold. If not, further monitoring occurs at block 260. When it is determined that the RSSI value does exceed the threshold, control passes from diamond 270 to block 280. At block 280 one or more gain components may be updated in a predetermined order based on the mode in which the receiver is operating (SENS or ACI). That is, in the SENS mode, filter gain back off occurs before LMT and/or attenuator back off. Instead in the ACI mode, LMT and/or attenuator back off may occur at least in part before filter back off. With this arrangement, the AGC controller uses the RSSI information for fine gain control to detect a signal level in the channel in the absence of blocker information (as is filtered by one or more filters). Although shown at this high level in the embodiment of FIG. 2, many variations and alternatives are possible.

Figure 3A:
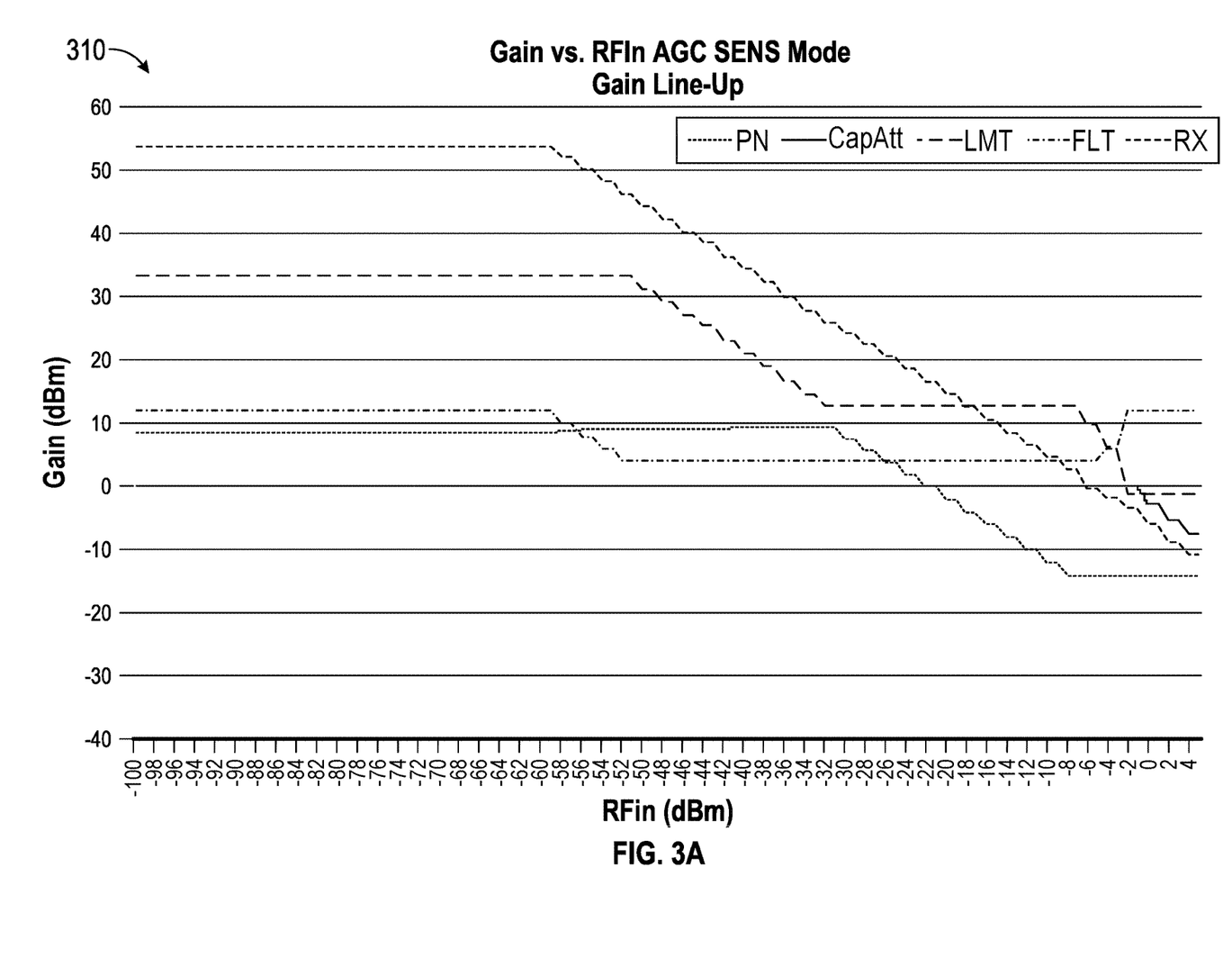
FIG. 3A is a graphical illustration of a gain lineup for an automatic gain control (AGC) sensitivity (SENS) mode in accordance with an embodiment.

Referring now to FIG. 3A, shown is a graphical illustration of a gain lineup for an AGC sensitivity mode in accordance with an embodiment. As shown in FIG. 3A, illustration 310 shows the dynamic gain control (on the Y-axis) as compared to an input RF signal level (on the X-axis). In this illustration, the varying gain levels of different gain components are shown.

Specifically, as shown in the inset, gain control levels are illustrated for each of a passive network (PN, e.g., resistive attenuator and/or capacitive attenuator (CapATT)), LMT stage (GM), and a filter stage. As illustrated in the sensitivity mode, as incoming signal levels increase from a low level to a high level, filter gain is first backed off. Thereafter, one or more components of the LMT block are backed off. Then the passive network is backed off, and additional LMT block back off occurs. Finally, when signal levels are relatively high, the capacitive attenuator may be reduced, while the filter gain may be increased. Of course while shown with this specific example in FIG. 3A, there can be many variations to an AGC operation.

Understand that to effect these dynamic gain control changes, an AGC controller may access information present in one or more gain tables. There may be at least one gain table for a SENS mode having a plurality of entries to store gain settings for corresponding power levels. As an example, each gain component may have a plurality of gain settings, each associated with a given detected power level (detected by a relevant power detector).

Figure 3B:
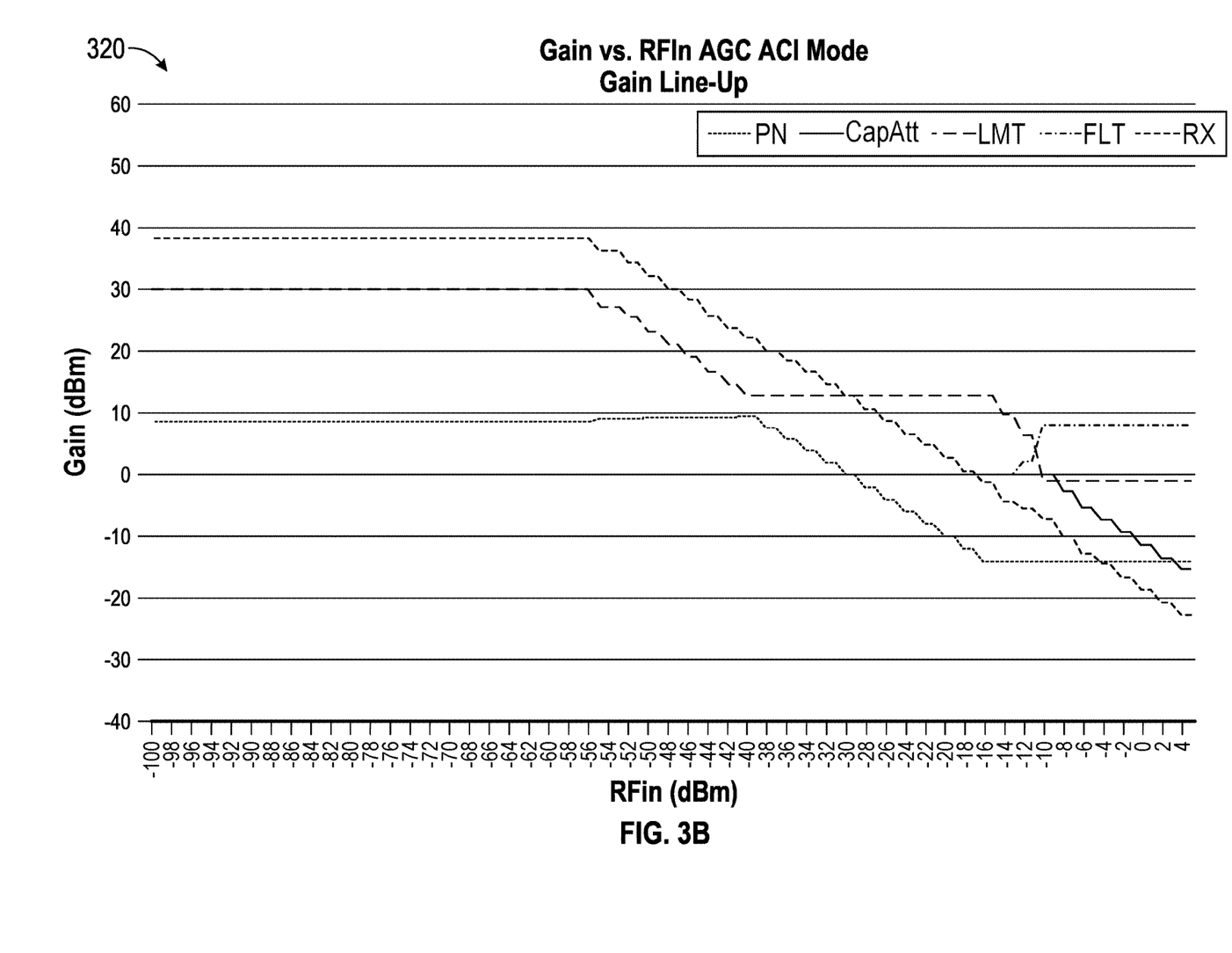
FIG. 3B is a graphical illustration of a gain lineup for an AGC adjacent channel interference (ACI) mode in accordance with an embodiment.

Referring now to FIG. 3B, shown is a graphical illustration of a gain lineup for an AGC ACI mode in accordance with an embodiment. Illustration 320 is similar to the arrangement in FIG. 3A. However here note that the order of back off differs, in that one or more gain components of the LMT block and the passive network are backed off before any filter back off occurs. As above, these gain changes can be effected with reference to at least one gain table for the ACI mode having a plurality of entries to store gain settings for corresponding power levels.

Figure 3C:
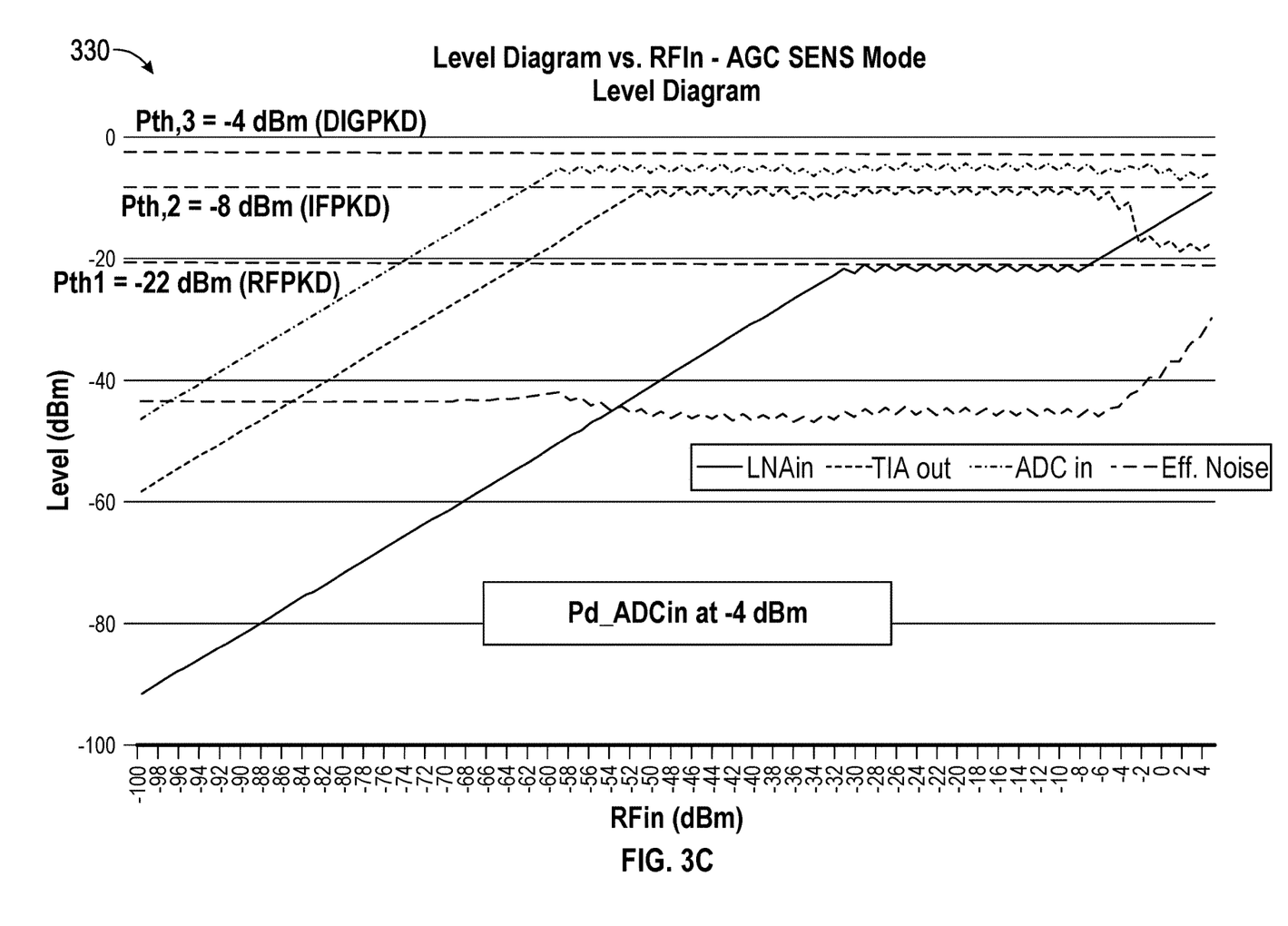
FIG. 3C is a graphical illustration of a signal level of a processed signal at different points in a receiver processing path in relation to a signal level of an incoming RF signal in operation in an AGC SENS mode in accordance with an embodiment.
Figure 3D:
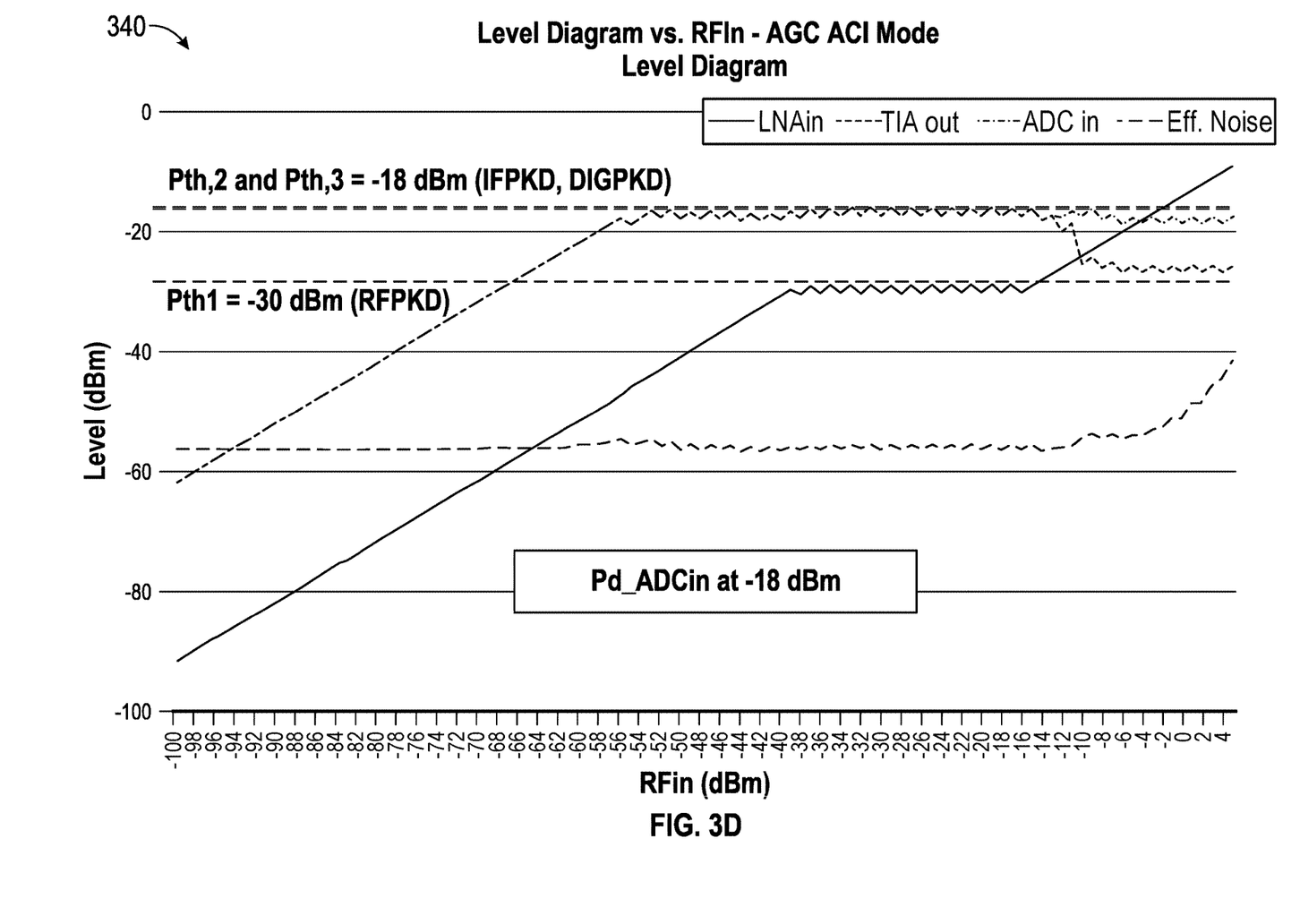
FIG. 3D is a graphical illustration of a signal level of a processed signal at different points in a receiver processing path in relation to a signal level of an incoming RF signal in operation in an AGC ACI mode in accordance with an embodiment.

Referring now to FIGS. 3C and 3D, shown are graphical illustrations of signal levels with respect to an incoming RF signal of varying power, at different points in a receiver signal processing path based on gain control in accordance with an embodiment (namely, signal levels for an AGC SENS mode in FIG. 3C and an AGC ACI mode in FIG. 3D).

As illustrated, in the graphical illustrations 330 and 340, the linear portions of the curves representing signal power at various receiver signal processing points (as RFIn increases) means that there no gain adjustment is occurring. Then when at or near a given threshold (for a given peak detector), the relatively steady signal power means that gain of a given gain block is being reduced as RFin signal strength increases. Note also that different thresholds may be used in the different AGC modes, and further note that the gain changes differ, e.g., based on table values.

Embodiments thus configure a receiver in the best noise profile, namely the sensitivity mode when the IF peak detector threshold is not met. Instead when this IF peak detector threshold is met, the receiver is configured in the best linearity profile, namely the ACI mode. This breaks the fundamental tradeoff across different conditions, such as for IEEE 802.11 a/b/g/n/ax and 20/40/80 MHz bandwidths, and can provide the best noise and linearity performance in real-time. Stated another way, embodiment provide improvements in sensitivity and blocking performance vis- à-vis the two different AGC modes, allowing a decoupling of the tradeoff across the different conditions.

Figure 4:
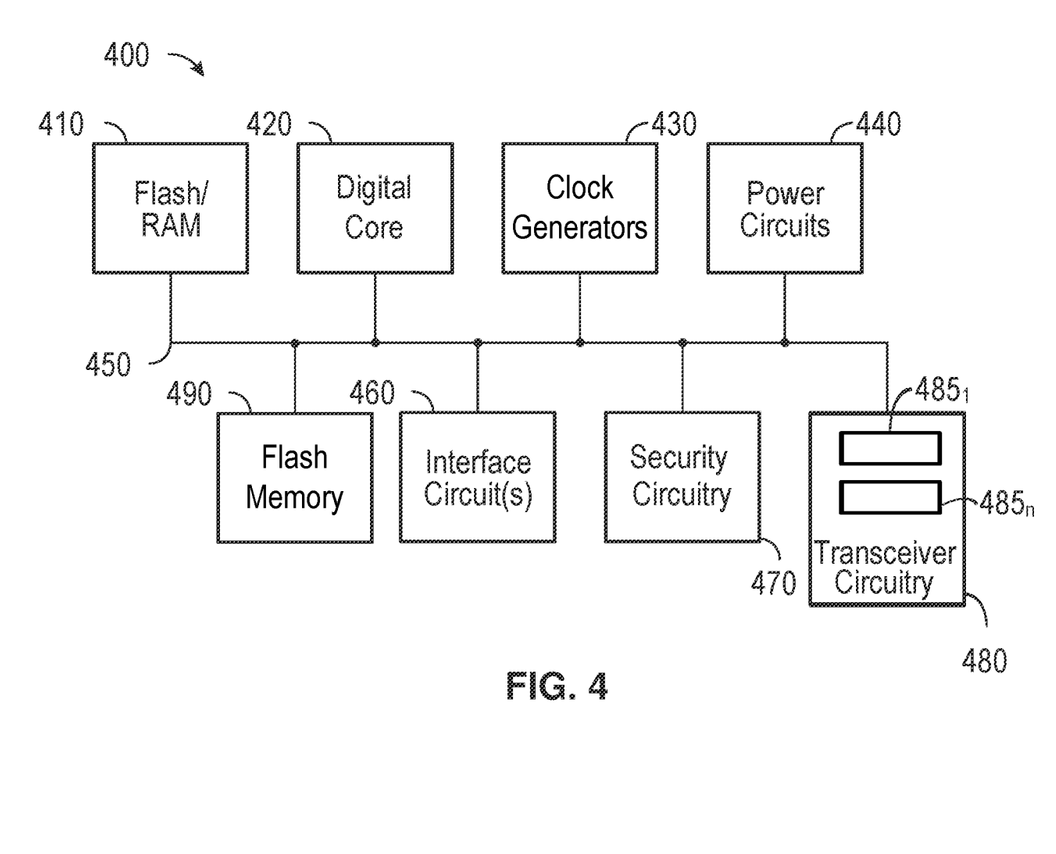
FIG. 4 is a block diagram of a representative integrated circuit that incorporates an embodiment.

Referring now to FIG. 4, shown is a block diagram of a representative integrated circuit 400 that includes controllable AGC circuitry to dynamically switch between AGC control modes as described herein. In the embodiment shown in FIG. 4, integrated circuit 400 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 400 shown in FIG. 4 may be implemented on a single semiconductor die.

Integrated circuit 400 may be included in a range of devices including a variety of stations, including smartphones, wearables, smart home devices, other consumer devices, or industrial, scientific, and medical (ISM) devices, among others.

In the embodiment shown, integrated circuit 400 includes a memory system 410 which in an embodiment may include volatile storage, such as RAM and non-volatile memory as a flash memory. As further shown integrated circuit 400 also may include a separate flash memory 490 (or other non-volatile memory), optionally. Flash memory 490 may be implemented as a non-transitory storage medium that can store instructions and data. Such non-volatile memory may store instructions, including instructions for identifying conditions that may trigger a change in AGC control modes, as described herein.

Memory system 410 couples via a bus 450 to a digital core 420, which may include one or more cores and/or microcontrollers that act as a main processing unit of the integrated circuit. In turn, digital core 420 may couple to clock generators 430 which may provide one or more phase locked loops or other clock generator circuitry to generate various clocks for use by circuitry of the IC.

As further illustrated, IC 400 further includes power circuitry 440, which may include one or more voltage regulators. Additional circuitry may optionally be present depending on particular implementation to provide various functionality and interaction with external devices. Such circuitry may include interface circuitry 460 which may provide a LAN or other interface with various off-chip devices, and security circuitry 470 which may perform wireless security techniques.

In addition, as shown in FIG. 4, transceiver circuitry 480 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 480 includes a AGC tables $485_{1-n}$ that can be dynamically selected, based on signal detection metrics, to provide gain control information for multiple AGC modes, including the AGC SENS and AGC ACI modes described herein. Understand while shown with this high level view, many variations and alternatives are possible.

Figure 5:
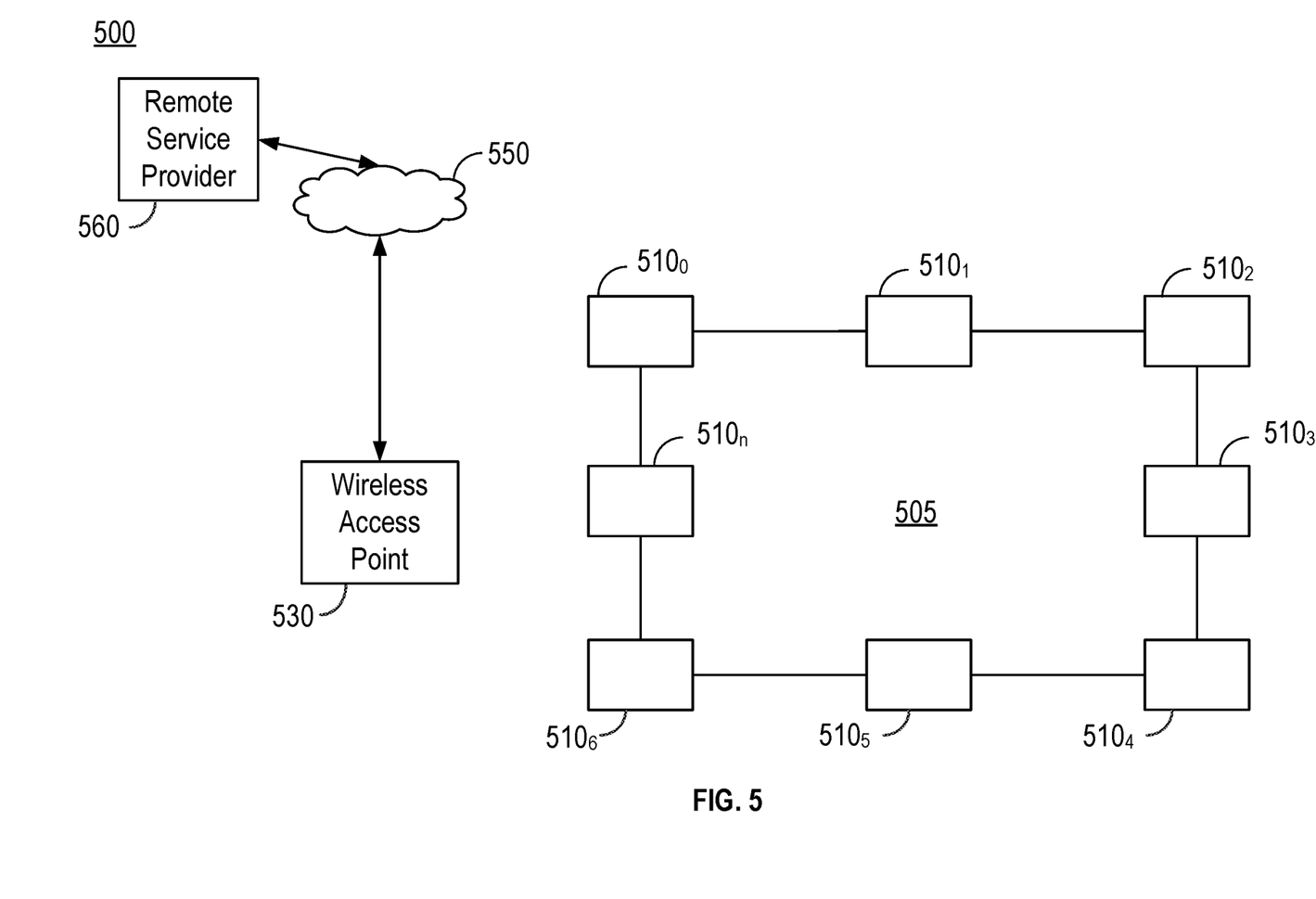
FIG. 5 is a high level diagram of a network in accordance with an embodiment.

ICs such as described herein may be implemented in a variety of different devices such as wireless stations, IoT devices or so forth. Referring now to FIG. 5, shown is a high level diagram of a network in accordance with an embodiment. As shown in FIG. 5, a network 500 includes a variety of devices, including wireless stations including smart devices such as IoT devices, access points and remote service providers, which may leverage embodiments for dynamically switching between different AGC control modes based at least in part on signal measurements at multiple points in a receiver signal processing path.

In the embodiment of FIG. 5, a wireless network 505 is present, e.g., in a building having multiple wireless devices $510_{0-n}$. As shown, wireless devices 510 couple to an access point 530 that in turn communicates with a remote service provider 560 via a wide area network 550, e.g., the internet. Understand while shown at this high level in the embodiment of FIG. 5, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A receiver comprising:
   a low noise amplifier (LNA) to receive and amplify a radio frequency (RF) signal;
   a mixer to downconvert the amplified RF signal to an intermediate frequency (IF) signal;
   a programmable gain amplifier (PGA) coupled to the mixer to amplify the IF signal, the LNA, the mixer, and the PGA having a first controllable gain;
   a filter coupled to the PGA to filter the amplified IF signal, the filter having a second controllable gain;
   a digitizer coupled to the filter to digitize the filtered amplified IF signal to a digitized signal;
   a first power detector coupled to an input of the LNA, the first power detector to output a first detection signal in response to the RF signal exceeding a first threshold;
   a second power detector coupled to an output of the PGA, the second power detector to output a second detection signal in response to the amplified IF signal exceeding a second threshold; and
   a controller to transition from an automatic gain control (AGC) sensitivity (SENS) mode to an AGC adjacent channel interference (ACI) mode in response to the second detection signal.

2. The receiver of claim 1, wherein in the AGC ACI mode, the controller is to first back off the second controllable gain and thereafter back off the first controllable gain.

3. The receiver of claim 2, further comprising at least one RF gain component coupled to an input of the LNA, the at least one RF gain component having a third controllable gain, wherein, after the back off of the first controllable gain, the controller is to back off the third controllable gain.

4. The receiver of claim 3, wherein the controller is to thereafter remove the third controllable gain, and if a signal metric information exceeds a third threshold, the controller is to further adjust the first controllable gain.

5. The receiver of claim 2, wherein in the AGC SENS mode, the controller is to first back off the second controllable gain and thereafter back off the first controllable gain.

6. The receiver of claim 1, wherein in response to the first detection signal, the controller is to directly back off a gain of at least one RF gain component.

7. The receiver of claim 6, wherein in response to the first detection signal, the controller is to directly back off the gain of the at least one RF gain component until the first detection signal indicates that the RF signal is less than the first threshold.

8. The receiver of claim 1, wherein:
in the AGC SENS mode, the controller is to optimize the receiver for noise performance; and
in the AGC ACI mode, the controller is to optimize the receiver for linearity and headroom.

9. The receiver of claim 8, wherein in the AGC SENS mode, the controller is to cause a maximum RF gain setting for at least the LNA.

10. The receiver of claim 9, wherein in the AGC SENS mode, the controller is to cause the maximum RF gain setting for at least the LNA, unless a blocker signal is detected.

11. The receiver of claim 8, further comprising a plurality of gain tables, wherein at least one first gain table is associated with the AGC SENS mode and at least one second gain table is associated with the AGC ACI mode.

12. A method comprising:
setting, via a controller of a receiver, a plurality of gain components of the receiver for a maximum gain setting for an automatic gain control (AGC) sensitivity (SENS) mode;
receiving, in a controller of the receiver, an indication that a power level of an amplified intermediate frequency (IF) signal measured at an output of an IF amplifier of the receiver exceeds a first threshold, the IF signal derived from a radio frequency (RF) signal received in the receiver; and
transitioning from the AGC SENS mode to an AGC adjacent channel interference (ACI) mode in response to the indication that the power level of the amplified IF signal exceeds the first threshold.

13. The method of claim 12, further comprising dynamically adjusting a gain setting for one or more of the plurality of gain components of the receiver based on a received signal strength indication obtained from a digital processor of the receiver.

14. The method of claim 13, wherein dynamically adjusting the gain setting for one or more of the plurality of gain components comprises:
dynamically adjusting the gain setting for the one or more of the plurality of gain components in a first order for the AGC SENS mode; and
dynamically adjusting the gain setting for the one or more of the plurality of gain components in a second order for the AGC ACI mode.

15. The method of claim 12, further comprising adjusting a gain setting of a filter of the receiver, the filter coupled to an output of the IF amplifier, in response to the indication that the power level of the amplified IF signal exceeds the first threshold.

16. The method of claim 12, further comprising:
receiving, in the controller of the receiver, an indication that a power level of the RF signal exceeds a second threshold; and
dynamically adjusting a gain setting for at least one RF gain component of the receiver in response to the indication that the power level of the RF signal exceeds the second threshold.

17. The method of claim 12, further comprising:
in the AGC SENS mode, optimizing the receiver for noise performance; and
in the AGC ACI mode, optimizing the receiver for linearity.

18. A wireless device comprising:
an antenna to transmit a transmit radio frequency (RF) signal and to receive a receive RF signal; and
an integrated circuit (IC) coupled to the antenna, the IC comprising:
an attenuator controllable to attenuate the receive RF signal, the attenuator comprising a first gain control region;
a low noise amplifier (LNA) coupled to the attenuator, the LNA to receive and amplify the receive RF signal;
a mixer to downconvert the amplified receive RF signal to an intermediate frequency (IF) signal;
an IF amplifier coupled to the mixer to amplify the IF signal, the LNA, the mixer, and the IF amplifier comprising a second gain control region;
a filter coupled to the IF amplifier to filter the amplified IF signal, the filter comprising a third gain control region;
a digitizer coupled to the filter to digitize the filtered amplified IF signal to a digitized signal;
a digital signal processor (DSP) coupled to the digitizer, the DSP to process the digitized signal;
a first power detector coupled to an output of the attenuator, the first power detector to output a first detection signal in response to the receive RF signal output from the attenuator exceeding a first threshold;
a second power detector coupled to an output of the IF amplifier, the second power detector to output a second detection signal in response to the amplified IF signal exceeding a second threshold; and
a controller to transition from an automatic gain control (AGC) sensitivity (SENS) mode to an AGC adjacent channel interference (ACI) mode in response to the second detection signal.

19. The wireless device of claim 18, further comprising a storage to store a plurality of gain tables, wherein at least one first gain table is associated with the AGC SENS mode and at least one second gain table is associated with the AGC ACI mode.

20. The wireless device of claim 18, wherein the controller is to:
dynamically adjust the first gain control region, the second gain control region and the third gain control region in a first order for the AGC SENS mode; and
dynamically adjust the first gain control region, the second gain control region and the third gain control region in a second order for the AGC ACI mode.

\* \* \* \* \*

UNITED STATES PATENT AND TRADEMARK OFFICE
CERTIFICATE OF CORRECTION

| | | |
|---|---|---|
| PATENT NO. | : 12,334,889 B1 | Page 1 of 1 |
| APPLICATION NO. | : 18/539468 | |
| DATED | : June 17, 2025 | |
| INVENTOR(S) | : Rangakrishnan Srinivasan and Abdulkerim Coban | |

It is certified that error appears in the above-identified patent and that said Letters Patent is hereby corrected as shown below:

On the Title Page

Item (54) and In the Specification, Column 1, Lines 1-2:
"GAIN CONTOL TO OPTIMIZE SENSITIVITY AND BLOCKING PERFORMANCE"
Should be:
--GAIN CONTROL TO OPTIMIZE SENSITIVITY AND BLOCKING PERFORMANCE--.

Signed and Sealed this
Fifth Day of August, 2025

Coke Morgan Stewart
*Acting Director of the United States Patent and Trademark Office*